US009692370B2

(12) United States Patent
Chiu et al.

(10) Patent No.: US 9,692,370 B2
(45) Date of Patent: Jun. 27, 2017

(54) BIASING CIRCUITRY

(71) Applicant: WIN Semiconductors Corp., Tao Yuan (TW)

(72) Inventors: Jui-Chieh Chiu, Taoyuan (TW); Fan-Hsiu Huang, New Taipei (TW); Chih-Wen Huang, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 8 days.

(21) Appl. No.: 14/862,144

(22) Filed: Sep. 22, 2015

(65) Prior Publication Data

US 2016/0373068 A1   Dec. 22, 2016

(30) Foreign Application Priority Data

Jun. 17, 2015   (TW) .............................. 104119661 A

(51) Int. Cl.
*H03F 3/04* (2006.01)
*H03F 3/21* (2006.01)
*H03F 1/30* (2006.01)
*H03F 3/19* (2006.01)

(52) U.S. Cl.
CPC .............. *H03F 3/21* (2013.01); *H03F 1/303* (2013.01); *H03F 3/19* (2013.01); *H03F 2200/27* (2013.01); *H03F 2200/294* (2013.01); *H03F 2200/451* (2013.01)

(58) Field of Classification Search
CPC ..................................................... H03F 1/0222
USPC ...................... 330/296, 285, 288, 302, 207 P
See application file for complete search history.

(56) References Cited

U.S. PATENT DOCUMENTS

| 5,268,649 | A | * | 12/1993 | Jones | ........................ H03F 1/52 330/296 |
| 7,154,336 | B2 | | 12/2006 | Maeda | |
| 2003/0146790 | A1 | * | 8/2003 | Arell | ....................... G05F 3/265 330/296 |

OTHER PUBLICATIONS

F. Carrara, A. Scuderi, A. Scuderi, G. Bottiglieri and G. Palmisano, "Silicon bipolar linear power amplifier for WCDMA mobile applications," International Symposium on Circuits and Systems, 2005. ISCAS IEEE, vol. 3, 2005, pp. 2679-2682.

(Continued)

*Primary Examiner* — Khanh V Nguyen
*Assistant Examiner* — Khiem Nguyen
(74) *Attorney, Agent, or Firm* — Winston Hsu

(57) ABSTRACT

A biasing circuitry is disclosed. The biasing circuitry includes a biasing module, electrically connected to a power amplifier; and a control series, having an end electrically connected to a positive voltage, and another end electrically connected to the biasing module. The control series includes a switch unit, controlled by a control voltage to be on or off; and a voltage-drop unit, connected to the switch unit in series. The voltage-drop unit is configured to adjust a bias point of the power amplifier.

7 Claims, 4 Drawing Sheets

(56) References Cited

OTHER PUBLICATIONS

B. Kim, C. Kwak and J. Lee, "A Dual-Mode Power Amplifier With On-Chip Switch Bias Control Circuits for LTE Handsets," IEEE Transactions on Circuits and Systems II: Express Briefs, vol. 58, No. 12, pp. 857-861, Dec. 2011.
A. Grebennikov, B. Sogl, H. Herrmann, C. Roth and W. Thomann, "High-efficiency balanced switched-path monolithic SiGe HBT power amplifiers for wireless applications," Proceedings of the 2nd European Microwave Integrated Circuits Conference, 2007 EuMA, European, Munich, Germany, Oct. 2007, pp. 391-394.
Ki Young Kim, Ji Hoon Kim, Youn Sub Noh and Chul Soon Park, "Cellular/PCS dual-band MMIC power amplifier of a newly devised single-input single-chain network," Gallium Arsenide Integrated Circuit (GaAs IC), Symposium 2003. 25th Annual Technical Digest, 2003 IEEE, San Diego, CA, USA, 2003, pp. 131-134.

* cited by examiner

BIASING CIRCUITRY

BACKGROUND OF THE INVENTION

1. Field of the Invention

The present invention relates to a biasing circuitry, and more particularly, to a biasing circuitry capable of adjusting a bias point of an amplifying circuit.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

In the prior art, the biasing module is usually formed within a die via a semiconductor process. However, due to the semiconductor process or other manufacture factors, some errors of characteristics of an internal circuit of the biasing module (e.g., the equivalent resistance or the voltage drop of the internal circuit of the biasing module) may be occurred, such that the bias point is not correct and the performance of the amplifying circuit is degraded. Furthermore, after the biasing module is formed within the die, it is not able to change the characteristics of the internal circuit of the biasing module, which is inconvenient in circuit design perspective. Therefore, it is necessary to improve the prior art.

SUMMARY OF THE INVENTION

It is therefore a primary objective of the present invention to provide a biasing circuitry capable of adjusting a bias point of an amplifying circuit, to improve over disadvantages of the prior art.

An embodiment of the present invention discloses a biasing circuitry, configured to provide a bias point for an amplifying circuit, the biasing circuitry comprising a biasing module, formed within a first die via a semiconductor process, the biasing module electrically connected to the amplifying circuit; and a control series, having an end electrically connected to a positive voltage and another end electrically connected to the biasing module, the control series comprising a switch unit, controlled by a control voltage to be conducted or cutoff; and a voltage-drop unit, connected to the switch unit in series, configured to adjust the bias point of the amplifying circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
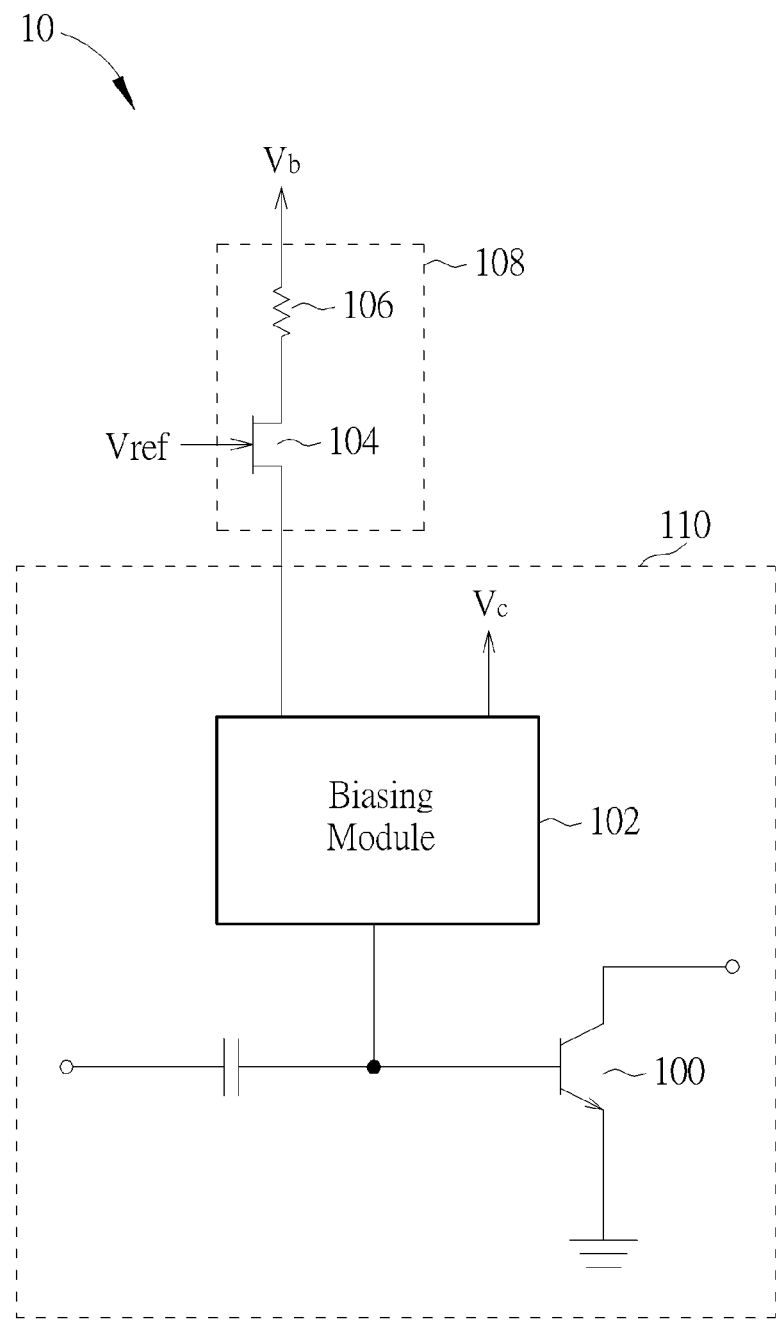
FIG. 1 is a schematic diagram of a biasing circuitry according to an embodiment of the present invention.

FIG. 1 is a schematic diagram of a biasing circuitry 10 according to an embodiment of the present invention. The biasing circuitry 10 is configured to provide a specific bias point for an amplifying circuit 100. As shown in FIG. 1, the amplifying circuit 100 may be a transistor, which may function as a power amplifier (PA) or a low noise amplifier (LNA). The biasing circuitry 10 comprises a biasing module 102, a switch unit 104 and a voltage-drop unit 106. The biasing module 102 is formed within a first die 110. An end of the biasing module 102 is electrically connected to a positive voltage Vc, and another end of the biasing module 102 is electrically connected to an input terminal of the amplifying circuit 100, providing the bias point to the amplifying circuit 100. The switch unit 104 may be a field effect transistor (FET), and a gate of the switch unit 104 is configured to receive a control voltage Vref. In other words, the control voltage Vref controls the switch unit 104 to be conducted or cutoff, so as to control the amplifying circuit 100 to be conducted or cutoff as well. The voltage-drop unit 106 is connected to the switch unit 104 in series, which means that the voltage-drop unit 106 and the switch unit 104 form a control series 108. An end of the control series 108 is electrically connected to a positive voltage Vb, and another end of the control series 108 is electrically connected to the biasing module 102. The voltage-drop unit 106 may be a resistor. By adjusting a resistance of the voltage-drop unit 106, the bias point of the amplifying circuit 100 is adjusted. Moreover, the voltage-drop unit 106 or the switch unit 104 is disposed outside the first die 110, i.e., the voltage-drop unit 106 or the switch unit 104 is disposed within a print circuit board (PCB) or another die outside the first die 110.

Notably, the biasing module 102 is formed within the first die via a semiconductor process. When errors of characteristics of the internal circuit of the biasing module 102 (e.g., the equivalent resistance or the voltage drop of the internal circuit of the biasing module) are occurred due to the semiconductor process or other manufacture factors, the bias point applied to the amplifying circuit 100 would be incorrect or inaccurate, and there is no way to change the characteristics of the biasing module 102 (since the biasing module 102 is formed as the first die) to adjust the bias point providing to the amplifying circuit 100. Nevertheless, according to the biasing circuitry 10, note that the voltage-drop unit 106 or the switch unit 104 is disposed outside the first die. Even the biasing module 102 is already formed as the first die and there is no way to change the characteristics of the internal circuit of the biasing module 102, it is still possible to provide the correct and accurate bias point to the amplifying circuit 100 by adjusting the characteristics of the voltage-drop unit 106 which is outside the biasing module 102, such that the amplifying circuit 100 may still achieve good performance (e.g., linearity).

Figure 2:
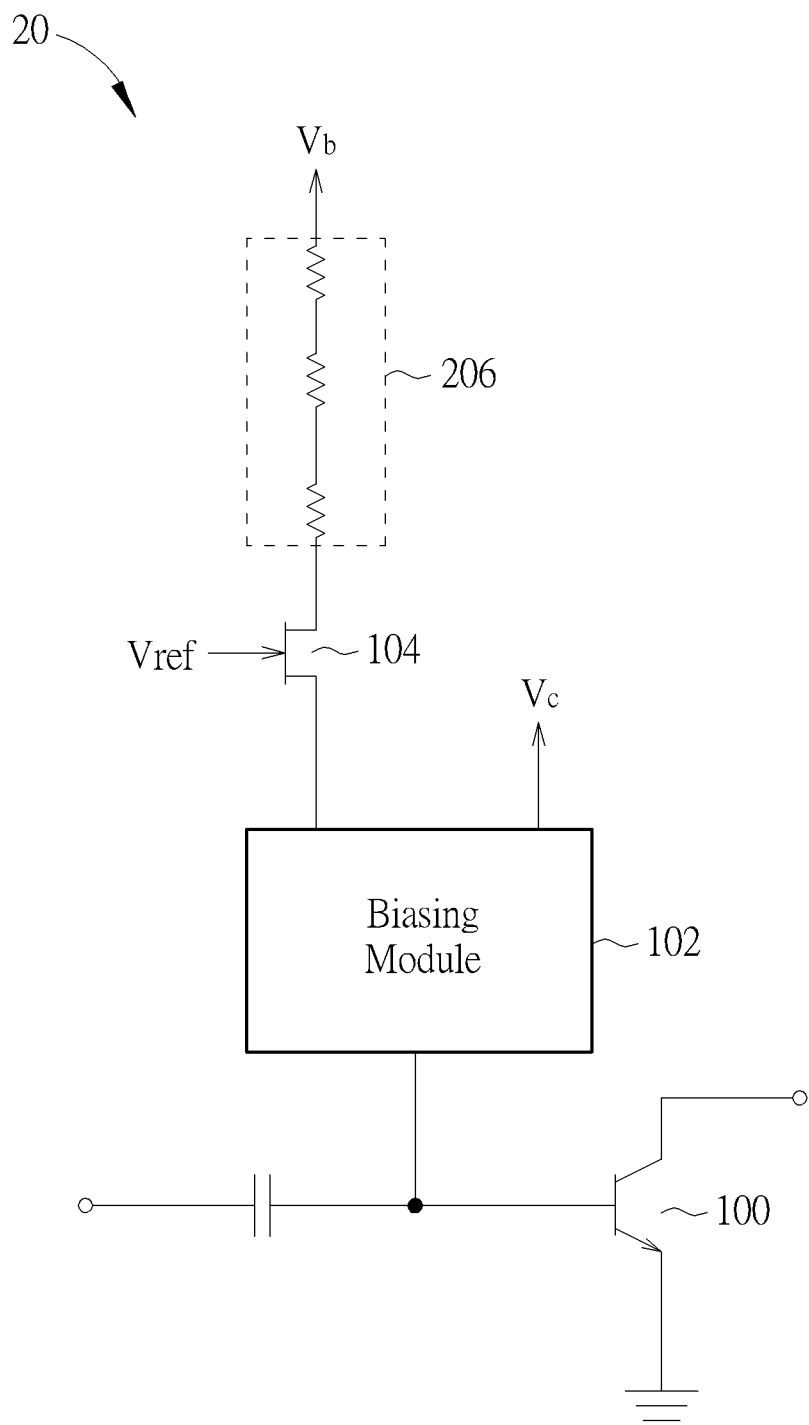
FIG. 2 is a schematic diagram of a biasing circuitry according to an embodiment of the present invention.
Figure 3:
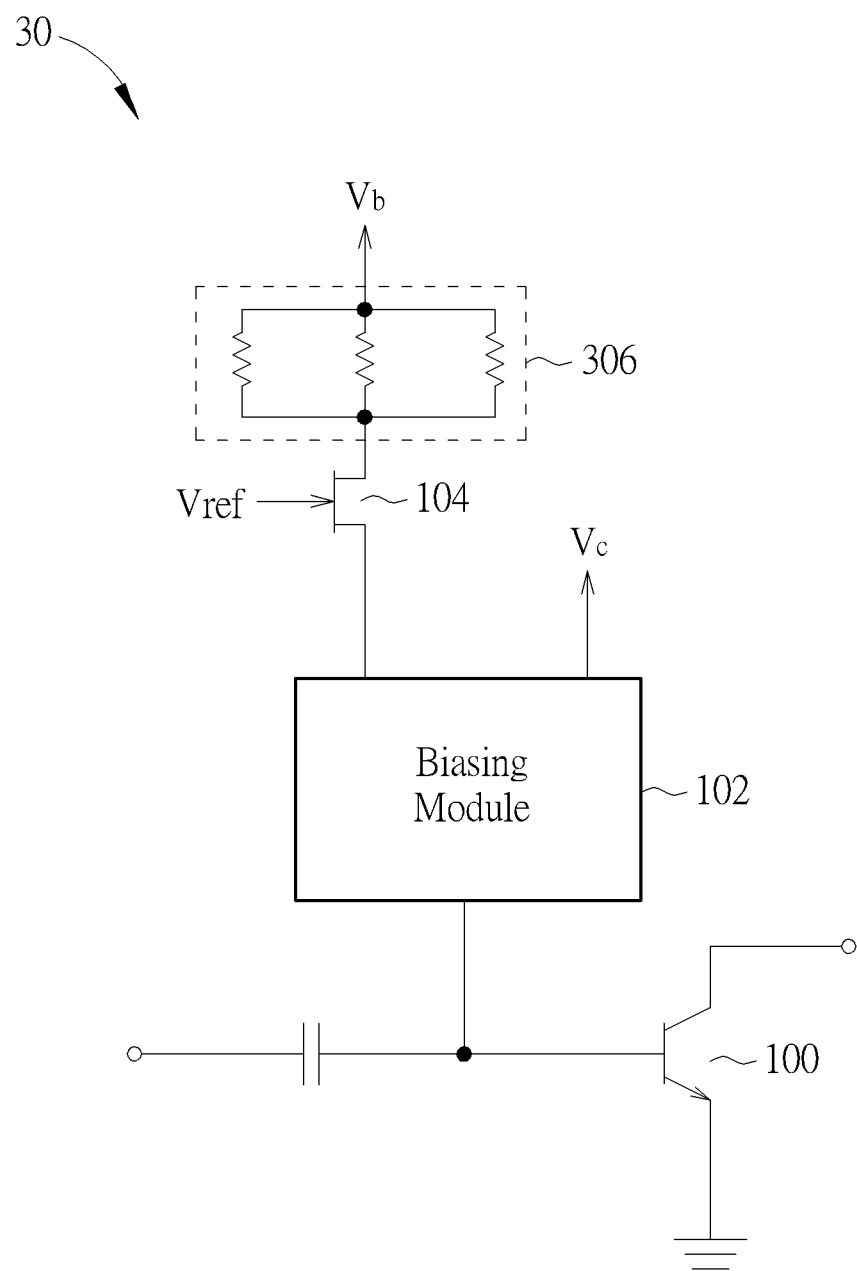
FIG. 3 is a schematic diagram of a biasing circuitry according to an embodiment of the present invention.

Notably, in order to adjust the bias point of the amplifying circuit 100, the voltage-drop unit is not limited to consisting of only one resistance. The voltage-drop unit may comprise a plurality of resistances which are connected either in series or in parallel. For example, FIG. 2 and FIG. 3 are schematic diagrams of a biasing circuitry 20 and a biasing circuitry 30, respectively, according to embodiments of the present invention. The biasing circuitry 20 and the biasing circuitry 30 are similar to the biasing circuitry 10, and thus, the same symbols remain the same denotations. Different from the biasing circuitry 10, the biasing circuitry 20 and the biasing circuitry 30 each comprise a voltage-drop unit 206 and a voltage-drop unit 306, respectively. The voltage-drop unit 206 comprises a plurality of resistances which are connected with each other in series, and the voltage-drop unit 306 comprises a plurality of resistances which are connected with each other in parallel. As can be seen from FIG. 2 and FIG. 3, when some errors of characteristics of an internal circuit of the biasing module 102 are occurred due to the semiconductor process or other manufacture factors and the bias point applied to the amplifying circuit 100 is incorrect or inaccurate, the correct and accurate bias point may be applied to the amplifying circuit 100 by increasing or decreasing overall resistance values of the voltage-drop unit 206 and the voltage-drop unit 306, such that the amplifying circuit 100 may have good linearity.

In the prior art, since some errors of characteristics of the internal circuit of the biasing module (e.g., the equivalent resistance or the voltage drop of the internal circuit of the biasing module) may be occurred due to the semiconductor process or other manufacture factors and there is no way to change the characteristics of the biasing module 102 after the biasing module 102 is formed as the die, the bias point applied to the amplifying circuit is incorrect or inaccurate, such that the performance of the amplifying circuit is degraded. On the contrary, the present invention is able to adjust the characteristics of the voltage-drop unit outside the biasing module, so as to compensate the error occurred due to the semiconductor process or the manufacture factors and provide the correct and accurate bias point to the amplifying circuit, such that the performance of the amplifying circuit would not be degraded.

Figure 4:
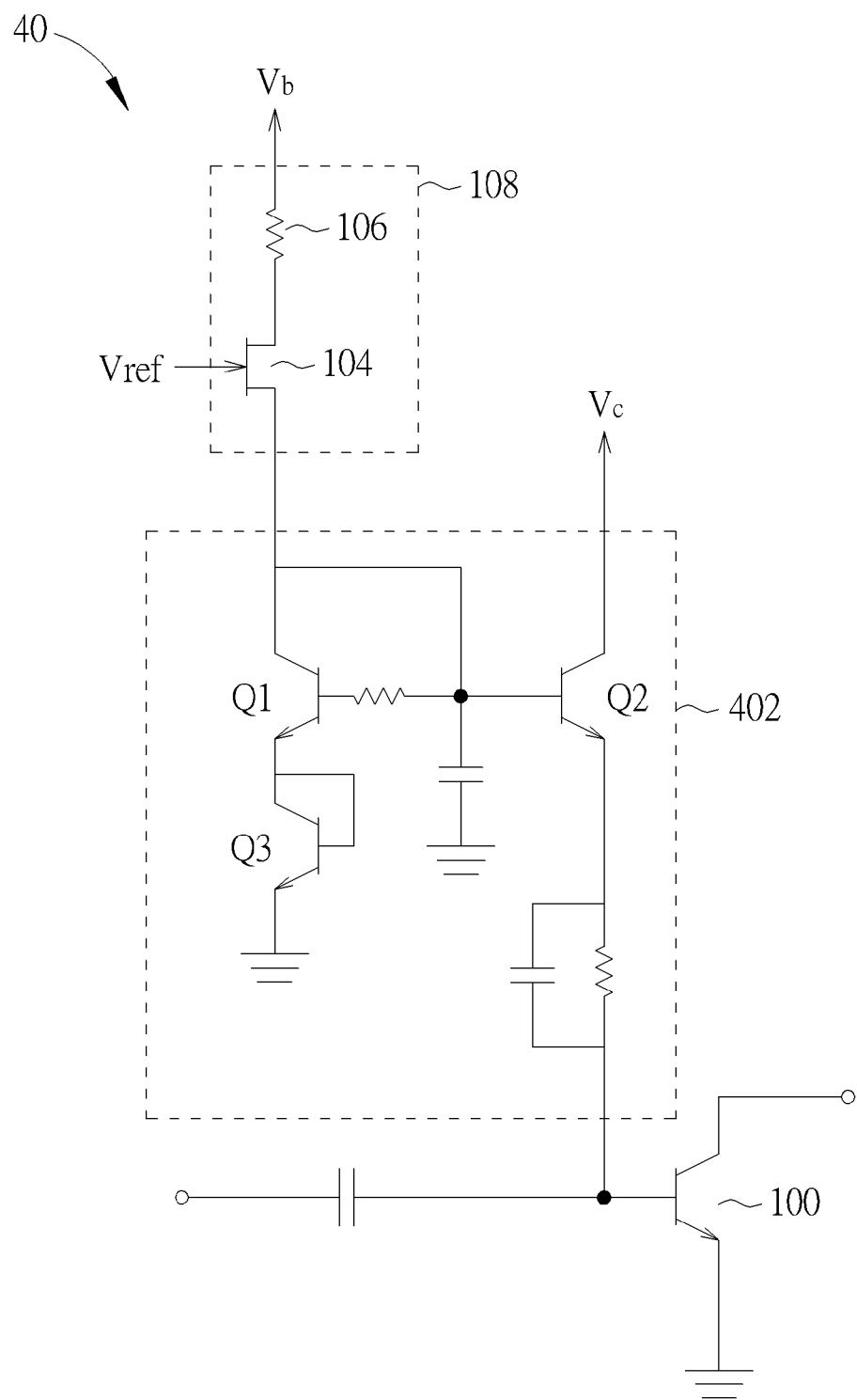
FIG. 4 is a schematic diagram of an internal circuitry inside a biasing module according to an embodiment of the present invention.

Notably, the embodiments stated in the above are utilized for illustrating concepts of the present invention. Those skilled in the art may make modifications and alternations accordingly, and not limited herein. For example, the amplifying circuit 100 and the biasing module 102 may comprise heterojunction bipolar transistors (HBT) or high electron mobility transistors (HEMT), and not limited thereto. In addition, the switch unit 104 may be a high electron mobility transistor (HEMT), and not limited thereto. The biasing module 102 may be formed within the first die via a Gallium Arsenide (GaAs) semiconductor process, and not limited thereto. In addition, the voltage-drop unit may be connected between the switch unit 104 and the positive voltage Vb. The voltage-drop unit 106 and the switch unit 104 may be disposed in an external circuit, wherein the external circuit may be a second die or a print circuit board (PCB). Furthermore, the internal circuit of the biasing module is not limited. For example, FIG. 4 is a schematic diagram of an internal biasing circuit 402 realizing the biasing module 102 in FIG. 1 according to an embodiment of the present invention. The internal biasing circuit 402 comprises transistors Q1, Q2, Q3. The transistors Q1, Q2, Q3 may be HBTs. The internal biasing circuit 402 provides the fixed bias point to the amplifying circuit 100. The internal biasing circuit 402 may also be applied to the biasing circuitry 20, 30 in FIGS. 2, 3. Nevertheless, the internal circuit of the biasing module is not limited to be the circuit shown in FIG. 4. Other kinds of bias circuits may also be applied as the biasing module of the present invention. As long as the biasing module is electrically connected between the amplifying circuit and the control series, the requirements of the present invention is met.

In summary, the present invention may adjust the characteristics of the voltage-drop unit outside the biasing module to compensate the error of characteristics of the biasing module brought by the semiconductor manufacturing process. The correct and accurate bias point is provided to the amplifying circuit, and the performance of the amplifying circuit would not be degraded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A biasing circuitry, configured to provide a bias point for an amplifying circuit, the biasing circuitry comprising:
   a biasing module, formed within a first die via a semiconductor process, the biasing module electrically connected to the amplifying circuit and configured to provide the bias point to the amplifying circuit; and
   a control series, disposed outside the first die, having an end electrically connected to a positive voltage and another end electrically connected to the biasing module, the control series comprising:
      a voltage-drop unit, configured to adjust the bias point of the amplifying circuit; and
      a switch unit, connected to the voltage drop unit in series, controlled by a control voltage and configured to be conducted or cutoff, so as to control the amplifying circuit to be enabled or disabled.

2. The biasing circuitry of claim 1, wherein the amplifying circuit is a power amplifier or a low noise amplifier.

3. The biasing circuitry of claim 1, wherein the amplifying circuit comprises a heterojunction bipolar transistor (HBT) or a high electron mobility transistor (HEMT).

4. The biasing circuitry of claim 1, wherein the semiconductor process is a Gallium Arsenide (GaAs) semiconductor process.

5. The biasing circuitry of claim 1, wherein the switch unit is a field effect transistor (FET) or a high electron mobility transistor (HEMT).

6. The biasing circuitry of claim 5, wherein a gate of the switch unit is configured to receive the control voltage.

7. The biasing circuitry of claim 1, wherein the voltage-drop unit comprises at least a resistor, configured to adjust the bias point of the amplifying circuit.

* * * * *